(12) United States Patent
McCartney et al.

(10) Patent No.: US 7,152,121 B2
(45) Date of Patent: Dec. 19, 2006

(54) LOGICAL SEMANTIC COMPRESSION

(75) Inventors: Jason McCartney, Redmond, WA (US); Thomas F. Fakes, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/027,123

(22) Filed: Dec. 31, 2004

(65) Prior Publication Data

US 2005/0149553 A1    Jul. 7, 2005

Related U.S. Application Data

(62) Division of application No. 09/848,721, filed on May 2, 2001, now Pat. No. 7,082,478.

(51) Int. Cl.
G06F 15/16 (2006.01)
G06F 13/38 (2006.01)

(52) U.S. Cl. .................................. 709/247; 710/68

(58) Field of Classification Search ................ 709/203, 709/247; 710/68; 707/101; 375/240
See application file for complete search history.

(56) References Cited

U.S. PATENT DOCUMENTS

| | | | |
|---|---|---|---|
| 5,023,869 A | 6/1991 | Grover et al. | |
| 5,831,558 A | 11/1998 | Harvell | |
| 5,862,347 A | 1/1999 | Suzuki et al. | |
| 5,999,936 A | 12/1999 | Pattison et al. | |
| 5,999,949 A | 12/1999 | Crandall | |
| 6,009,456 A * | 12/1999 | Frew et al. | 709/202 |
| 6,219,716 B1 | 4/2001 | Kumaki | |
| 6,253,264 B1 | 6/2001 | Sebastian | |
| 6,301,394 B1 | 10/2001 | Trout | |
| 6,345,307 B1 * | 2/2002 | Booth | 709/247 |
| 6,370,536 B1 * | 4/2002 | Suzuki et al. | 707/101 |
| 6,404,431 B1 * | 6/2002 | Farmer | 345/428 |
| 6,420,980 B1 | 7/2002 | Ejima | |
| 6,466,999 B1 * | 10/2002 | Sliger et al. | 710/68 |
| 6,493,766 B1 * | 12/2002 | Buchholz et al. | 709/247 |
| 6,529,912 B1 | 3/2003 | Satoh et al. | |
| 6,532,121 B1 | 3/2003 | Rust et al. | |
| 6,728,785 B1 * | 4/2004 | Jungck | 709/247 |
| 6,883,137 B1 * | 4/2005 | Girardot et al. | 715/513 |
| 2002/0073116 A1 * | 6/2002 | Middleton | 707/513 |
| 2002/0156618 A1 | 10/2002 | Mathur et al. | |

FOREIGN PATENT DOCUMENTS

JP    07184194    12/1995

(Continued)

OTHER PUBLICATIONS

Cannataro et al., "Semantic lossy compression of XML data", In Knowledge Representation Meets Databases, 2001□□.*

(Continued)

*Primary Examiner*—William Vaughn
*Assistant Examiner*—Yemane M. Gerezgiher
(74) *Attorney, Agent, or Firm*—Lee & Hayes, PLLC

(57) ABSTRACT

Individual records of a data set include data and semantic information to describe the data. The records in the data set are encoded to generate an encoded data set using a compression function which is determined from semantic information that is common to multiple records of the data set. Multiple records of the encoded data set include the data without the common semantic information. The encoded data set is transmitted, or otherwise communicated, to a destination device along with an expansion function that includes the semantic information that is common to the multiple records of the data set. The destination device expands the encoded data set with the expansion function such that the multiple records of the encoded data set are expanded to include the common semantic information.

8 Claims, 8 Drawing Sheets

FOREIGN PATENT DOCUMENTS

JP                10283280           10/1998

OTHER PUBLICATIONS

Witten et al., "Semantic and generative models for lossy text compression", The Computer Journal, vol. 37, Issue 2, 1994.*

N.J. Larsson, "Structures of String Matching and Data Compression", Ph.D. Dissertation, Dept. of Computer Science, Lund University, Sweden, 1999.*

Apostolico et al., "Off-line compression by greedy textual substitution. Proc", IEEE, 2000, pp. 1733-1744.*

* cited by examiner

| Time Dep / Arv | Airline | Date | Departing Airport | Departing City | Arrival Airport | Arrival City |
|---|---|---|---|---|---|---|
| 202 0600 0830 | Express | May 2 | SEA | Seattle | LAX | Los Angeles |
| 204 0815 1045 | Express | May 2 | SEA | Seattle | LAX | Los Angeles |
| 206 1000 1230 | Express | May 2 | SEA | Seattle | LAX | Los Angeles |
| 208 1300 1530 | Express | May 2 | SEA | Seattle | LAX | Los Angeles |
| 210 1430 1700 | Express | May 2 | SEA | Seattle | LAX | Los Angeles |

Fig. 2

LOGICAL SEMANTIC COMPRESSION

RELATED APPLICATIONS

This application is a divisional of and claims priority to U.S. patent application Ser. No. 09/848,721 entitled "Logical Semantic Compression" filed May 2, 2001 now U.S. Pat. No. 7,082,478 to McCartney et al., the disclosure of which is incorporated by reference herein.

TECHNICAL FIELD

This invention relates to context-sensitive compression and, in particular, to systems and methods to logically compress common semantic information associated with data in a data set.

BACKGROUND

When a user of a client device, such as a personal computer, requests a data search from a server device in a client-server computing architecture, the data search can result in a large data set that is returned to the client. Typically, the time that it takes to return a large data set to a client is delayed by a low bandwidth connection at some point between the client device and the server device. This delay can significantly increase the time between when the user requests the data and when the data is displayed, or otherwise rendered, at the client device. In many cases, the delay can be significant enough that a user will cancel the request before the data is rendered for use. For an e-commerce site offering goods and/or services on the Internet, for example, canceled requests for a list of products can mean the difference between a successful or failed business venture.

The time that it takes to transmit data from one computing device to another is a common problem with many network systems. Often a delay in data transmission is likely to be caused by a low bandwidth connection associated with the client device, such as a consumer in the e-commerce example. Although an e-commerce site might be optimized to quickly serve a consumer request for data, the consumer might be slow to receive the data due to a limitation of the consumer's communication equipment, such as a common 56K modem. Accordingly, there is a need to reduce the time that it takes to transmit data from one device to another via a network system, while recognizing the limitations of existing communication devices.

Server systems, such as Web sites for example, attempt to work around the problem of a low bandwidth connection in relation to a large quantity of data to be transmitted by simply limiting, or partitioning, the return data set. However, partitioning or limiting a data set so that it can be returned in a reasonable amount of time may not correspond to the expectations of a consumer, or user of a client device, initiating the data request.

A consumer that initiates a request for all of the possible round-trip flight combinations within a particular week, for example, does not want to receive only ten choices when there are actually many more available to choose from. Additionally, the provider of the information does not want the return data set limited to only the ten choices because the consumer may choose to purchase the flight tickets elsewhere, when in fact the flight combination that the consumer desired was available, but not returned to the consumer as a possible choice.

This is a different type of data request from the typical search request where a user of a client device initiates an Internet search for a particular product or service and expects to receive the closest ten or so matches that correspond to the search criteria. From the closest matching results, the user can then select a particular provider of the product or service to make further inquiries.

For example, a consumer that desires to purchase a new portable computer initiates a search for distributors of new computers. After receiving the top ten or so matches that correspond to the request, the consumer can select a computer distributor and further initiate a data request for all of the portable computers available through the particular distributor. This data request is similar to the consumer request for all of the possible round-trip flight combinations within a particular week. The user does not want to receive only a few of the possible new portable computer choices when the particular computer distributor actually has many to choose from.

In addition to there being a need to reduce the time that it takes to transmit data from one computing device to another via a network system, there is also a need to be able to return a complete data set when requested, rather than only a partial or incomplete list of the data.

SUMMARY

Individual records of a data set include data and semantic information to describe the data. The records in the data set are encoded to generate an encoded data set using a compression function. The compression function is determined, or otherwise created, from semantic information that is common to multiple records of the data set. The semantic information in a particular record is a combination of the common data terms and/or data formatting information that is common to the multiple records in the data set. Multiple records of the encoded data set include the data without the common semantic information.

The encoded data set is transmitted, or otherwise communicated, to a destination device along with an expansion function that includes the semantic information that is common to the multiple records of the data set. The destination device expands the encoded data set using the expansion function such that the multiple records of the encoded data set are expanded to include the common semantic information. The data in the multiple records of the encoded data set can be rendered, or otherwise displayed, before or after the encoded data set is expanded using the expansion function.

Additionally, a compression function can be determined, or otherwise created, for a Web page structure that is common to multiple Web pages associated with a Web site. An encoded Web page structure is generated by removing the structure data that is common to the multiple Web pages.

The encoded Web page structure is transmitted, or otherwise communicated, to a destination device along with an expansion function that includes the common structure data. The destination device expands the encoded Web page structure using the expansion function and the Web page is constructed to display data received by the destination device.

BRIEF DESCRIPTION OF THE DRAWINGS

The same numbers are used throughout the drawings to reference like features and components.

FIG. 2 illustrates a data set of records that include data and semantic information in a data structure.

DETAILED DESCRIPTION

The following describes systems and methods for logical semantic compression which is context-sensitive compression, or data set encoding, of a data set of records, where the records have both data and semantic information that is common to multiple records in the data set. The semantic information in a record is associated with the data in the record to describe, define, or otherwise delineate the data. The semantic information in a particular record is a combination of the common data terms and/or data formatting information that is common to multiple records in the data set.

For a data set of records that have common semantic information, the information can be compressed, or removed, from the records which will decrease the time that it takes to transmit, or otherwise communicate, the data set from one device to another via a network system. In addition, the common semantic information can be transmitted from the one device to the other as an independent function such that the records in the data set can be expanded to again include both the data and the semantic information that describes the data.

Rather than transmitting each data set record from one device to another with both data and included semantic information, the actual size of the data set can be reduced by removing the common semantic information from the records and transmitting it only once. Reducing the size of the data set to be transmitted, or otherwise communicated, via a network system correlates to a decrease in the time that it takes to transmit the data set.

Figure 1:
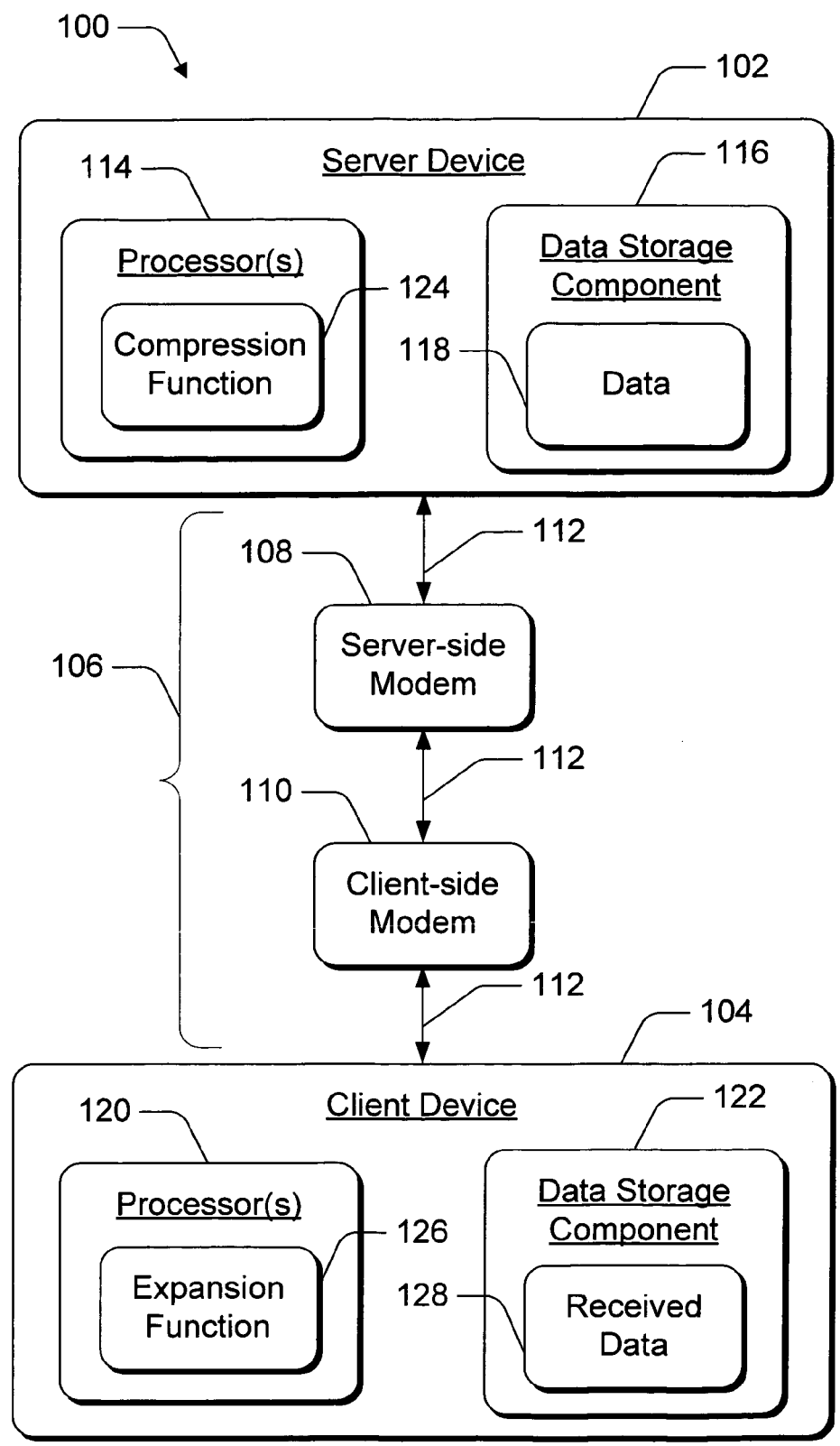
FIG. 1 is a block diagram that illustrates various components of a client-server network architecture.

FIG. 1 illustrates a logical semantic compression system 100 having components that can be implemented within a computing network system having one or more devices. The logical semantic compression system 100 includes a server device 102, a client device 104, and a network system 106. See the description of "Exemplary Computing System and Environment" below for specific examples and implementations of network and computing systems, computing devices, and components that can be used to implement the invention described herein, including server device 102, client device 104, and network system 106.

Network system 106 can be any type of network, such as a local area network (LAN) or a wide area network (WAN), using any type of network topology and any network communication protocol. In this example, network system 106 includes a server-side modem 108, a client-side modem 110, and logical connections 112 to facilitate data communication between the various components.

Server device 102 has one or more processors 114 and a data storage component 116. Processor(s) 114 process various instructions to control the operation of server device 102. Data storage component 116 stores data 118, and can be implemented as ROM (read only memory) and/or RAM (random access memory), a disk drive, a floppy disk drive, a CD-ROM drive, or any other component utilized for data storage. Similarly, client device 104 has one or more processors 120 and a data storage component 122.

The logical semantic compression system 100 can be implemented as a local area network computing system by a single entity that provides data from a central location, such as from server device 102, to one or more kiosks, such as to client device 104. Alternatively, the logical semantic compression system 100 can be implemented by two or more distinct entities that are connected via the Internet, for example.

When client device 104 initiates a data search request, the request is communicated to server device 102 via network system 106. A data search request can be initiated by user interaction with client device 104, or the request can be initiated automatically by an application executing on the client device processor(s) 120.

When server device 102 receives a data search request, the server device generates a data set from data 118 stored in the data storage component 116. Those skilled in the art will recognize that server device 102 can be implemented as multiple servers in a distributed computing environment, where each server can have data storage components and searchable data to service a data search request.

Server device 102 has a compression function 124 that executes on processor(s) 114 to reduce the size of a data set that is to be transmitted, or otherwise communicated, to client device 104 via network system 106. From a data set, server device 102 generates an encoded data set using the compression function 124. Similarly, client device 104 has an expansion function 126 that executes on processor(s) 120 to expand an encoded data set received from server device 102. Expansion function 126 corresponds to compression function 124, such that a data set encoded with the compression function can be expanded with the expansion function. Server device 102 and client device 104 can include multiple corresponding compression and expansion functions.

Client device 104 stores received data 128 in the data storage component 122. When client device 104 receives an encoded data set from server device 102, the client device can expand the encoded data set with expansion function 126 and store the data set as received data 128. Alternatively, client device 104 can store the encoded data set as received data 128 without expanding the encoded data set. An encoded data set will require less space to store in data storage component 122 than will the data set after being expanded using the expansion function 126. In addition, client device 104 can route the data set to be printed or displayed, such as on a display device.

FIG. 2 illustrates a data set 200 of multiple records 202 through 210 that can be maintained in a data structure. The records 202 through 210 are an example of a data set derived from data 118 maintained by server device 102 in the data storage component 116 (FIG. 1). Individual records 202 through 210 in data set 200 include a time field 212, an airline field 214, a date field 216, a departing airport field 218, a departing city field 220, an arrival airport field 222, and an arrival city field 224.

Each of the record fields 212 through 224 can contain any numerical or alphanumerical value that uniquely identifies the data in the fields. Additionally, the combination of records and fields shown in data set 200 are merely an example to illustrate logical semantic compression. Those skilled in the art will recognize that any combination of records, fields, and data can be created and defined as a data set in a data structure, such that the combination can be encoded with logical semantic compression as described herein.

Individual records 202 through 210 include data about an airline flight, and semantic information to describe the data. Semantic information in a record is associated with the data in the record to describe, define, or otherwise delineate the data. In this instance, the "data" is logically identified as the information in time field 212 which indicates the departure and arrival time for a particular airline flight. The departure and arrival times are identified as the "data" of the record because the information in time field 212 varies with every record in data set 200.

The "semantic information" 226 is identified as data fields 214 through 224 which contain information that is common to the individual records 202 through 210 in data set 200. In this instance, the particular airline is commonly identified as "Express" in airline field 214. Additionally, each Express airline flight departs May $2^{nd}$ (date 216) from the Seattle airport (SEA) (departing airport 218), which is located in the city of Seattle (departing city 220), and arrives at the Los Angeles International Airport (LAX) (arrival airport 222), which is located in the city of Los Angeles (arrival city 224).

When client device 104 (FIG. 1), or a user at an airport kiosk for example, initiates a data search request for all airline flights offered by Express airline on May $2^{nd}$ from Seattle to Los Angeles, the request is communicated to server device 102 via network system 106. When server device 102 receives the data search request, the server device generates data set 200 (FIG. 2) from the data 118 stored in the data storage component 116.

Server device 102 encodes data set 200 with compression function 124 by removing the semantic information 226 that is common to the individual records 202 through 210 in data set 200. Compression function 124 is based on a context-sensitive, or a logical, determination of which data in data set 200 is common to multiple records in the data set (i.e., semantic information 226). The common data in a particular record is grouped, or identified, as the semantic information for the particular record.

Encoding data set 200 using compression function 124 reduces the size of the data set before transmitting it to a destination device, such as client device 104. In this instance, the encoded data set will include records 202 through 210 having only the departure and arrival time information in time field 212. Reducing the size of data set 200 before transmitting it to client device 104 via network system 106 directly translates to a decrease in the time that it takes to transmit the data set.

Expansion function 126 at client device 104 is also determined based on the semantic information 226 that is common to the individual records 202 through 210 in data set 200. In this instance, expansion function 126 includes record fields 214 through 224. The expansion function is also transmitted to client device 104 via network system 106, such that when client device 104 receives the encoded data set from server device 102, the encoded data set can be expanded using expansion function 126. When records 202 through 210 are expanded with expansion function 126 at client device 104, the client device will have a completely restructured data set 200 that can be stored as received data 128.

The decrease in the time that it takes to transmit a requested data set to a destination device is derived by removing semantic information that is common to individual records in the data set, and transmitting the semantic information to the destination device only once as part of an expansion function. In this instance, semantic information 226 is transmitted from server device 102 to client device 104 only once as part of expansion function 126.

Logical semantic compression and expansion functions for a data set can be determined and created prior to receiving any query or search request for data. The developer of a database that data sets are generated from, having prior knowledge of the records structure, can create or develop the compression and expansion functions that will be applicable to multiple records in the server database. Those skilled in the art will recognize that a server database can maintain multiple records of varying structure, and that multiple compression and expansion functions can be created prior to a data set request to accommodate logical semantic compression of a particular data set with identified compression and expansion functions.

Figure 3:
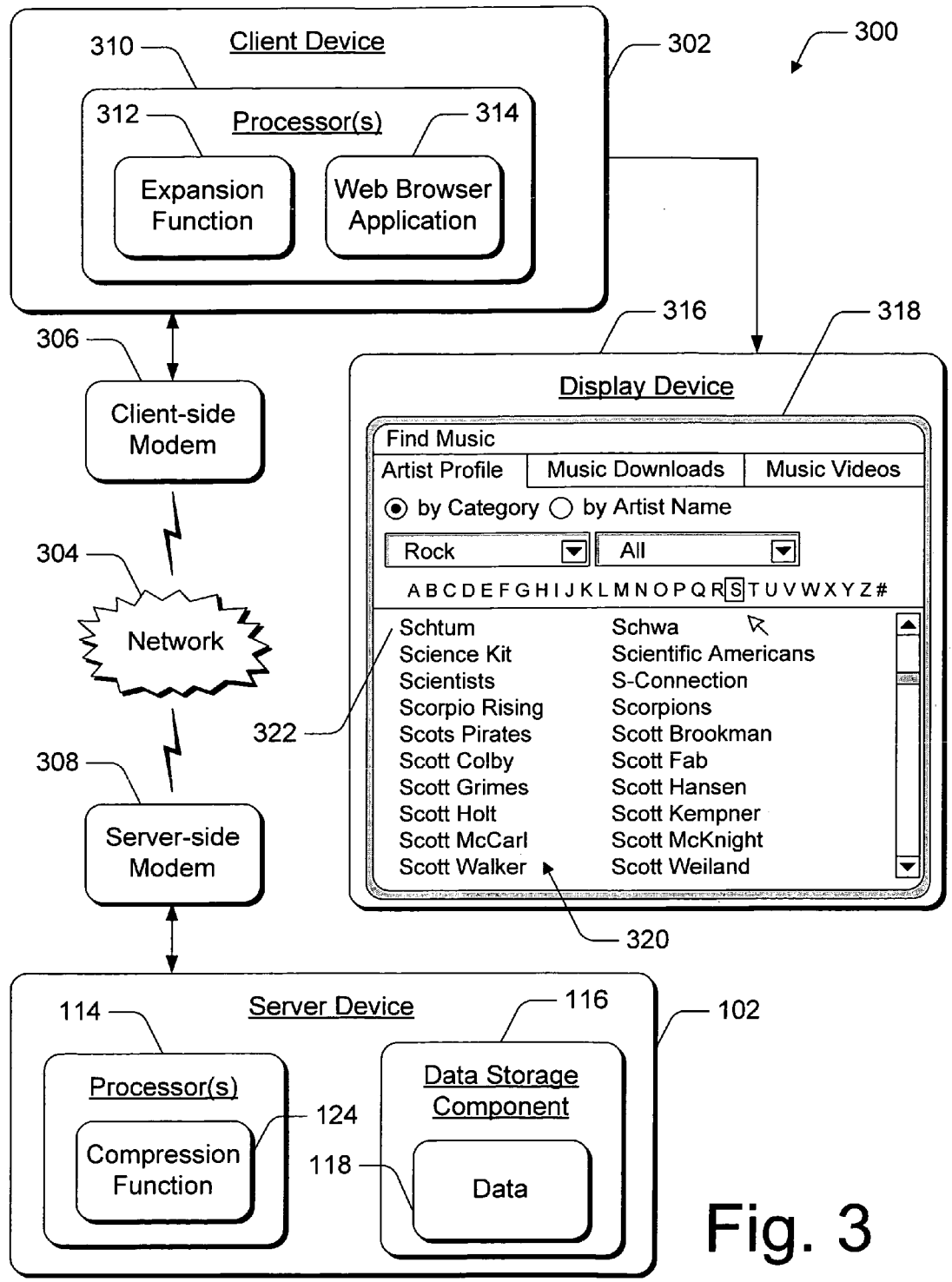
FIG. 3 is a block diagram that illustrates various components of a client-server network architecture.

FIG. 3 illustrates a logical semantic compression system 300 having components that can be implemented within a computing network system having one or more devices. The logical semantic compression system 300 includes a server device 102, a client device 302, and a network system 304. See the description of "Exemplary Computing System and Environment" below for specific examples and implementations of network and computing systems, computing devices, and components that can be used to implement the invention described herein, including server device 102, client device 302, and network system 304.

Network system 304 can be any type of network, such as a local area network (LAN) or a wide area network (WAN), using any type of network topology and any network communication protocol. In this example, network system 304 communicates with client device 302 via a client-side modem 306, and communicates with server device 102 via a server-side modem 308. Server device 102, and the various components of server device 102, are described above with reference to FIG. 1.

Client device 302 has one or more processors 310 that process various instructions to control the operation of client device 302. When client device 302 initiates a data search request, the request is communicated to server device 102 via network system 304 and modems 306 and 308. A data search request can be initiated by user interaction with client device 302, or the request can be initiated automatically by an application executing on the client device processor(s) 310. A data search request can be in the form of a query for data in a server database, such as the data storage component 116 in server device 102. When server device 102 receives a data search or query request, the server device executes the query request and formulates a return data set from data 118 stored in the data storage component 116.

Server device 102 has a compression function 124 that executes on processor(s) 114 to reduce the size of a data set that is to be transmitted, or otherwise communicated, to client device 302. Similarly, client device 302 has an expansion function 312 that executes on processor(s) 310 to expand an encoded data set received from server device 102.

Client device 302 has a Web browser application 314 that executes on processor(s) 310 to facilitate requesting data from server device 102. Client device 302 is connected with a display device 316 to display data received from server device 102 via the Web browser application 314. When client device 302 receives an encoded data set from server device 102, the client device expands the encoded data set using expansion function 312.

FIG. 3 illustrates an example of requesting a large data set from a Web site (e.g., server device 102), and displaying the received data within a Web page 318 as individual data items 320 on the display device 316. Web page 318 illustrates that client device 302 requested a data search of all music artists starting with the letter "S" in the Rock category. Each music artist's name 320 is a record hyperlink having associated HTML (hypertext markup language) code that links to a selected music artists' home page where information about the artist can be found.

Multiple records in the music artist data set can be represented in the following HTML format, where "Schtum" is the particular name of the music artist associated with this record, and which corresponds to music artist 322 on Web page 318:

```
<td>
<a class=sublink
href=http://www.website.com/MediaGuide/artistinfo/artistinfo.asp?
    p_id=P_2007>Schtum</a>
</td>
```

Typically, all of the data in this record format is transmitted to the destination device (e.g., client device 302) with every music artist record in the data set to render the music artist record on Web page 318 and to provide the functionality of a hyperlink for each particular record. Repeating the transmission of all of the data in the record format for each music artist in the data set can significantly increase the time that it takes to transmit the data set through a low bandwidth connection, such as the client-side modem 306.

An expansion function for a music artist record in the data set can be created by determining the semantic information that is common to the individual records in the data set, and implementing a script function to remove the common semantic information from the individual records.

The information that is common to the music artist records in this example is "http://www.website.com/MediaGuide/artistinfo/artistinfo.asp?p_id=". An implementation of logical semantic compression results in the following expansion function for the music artist records in the data set which includes the information that is common to the music artist records:

```
function E(o)
{
    url='http://www.website.com/MediaGuide/artistinfo/
    artistinfo.asp?p_id=' + o.p;
    window.top.location = url;
}
```

This expansion function includes most of the common semantic information from the music artist records in the data set. The compression function encodes the individual records in the data set to generate an encoded data set. The records in the encoded data set include the following data which is transmitted to the destination device (e.g., client device 302) with every music artist record in the data set:

```
<td>
<a class=sublink href=# p="P_2007" onclick="E(this);">
Schtum</a>
</td>
```

This particular music artist record also corresponds to the artist data link "Schtum" which is music artist 322 on Web page 318. In this example, each record in the music artist data set is reduced in size from one-hundred and eleven (111) characters to sixty-nine (69) characters which is approximately a 38% overall reduction in the size of the data set that is transmitted to the destination device. The reduction in size of the data set translates into a significant decrease in the time that it takes to transmit, or otherwise communicate, the data set to client device 302.

This example further illustrates the scalability of logical semantic compression. The URL (uniform resource locator) in the expansion function, which is common to multiple music artist records, can be increased to any number of characters with no effect on the size of the encoded data set. This is because the common semantic information included in the expansion function is transmitted to the destination device only once.

Logical semantic compression can be applicable for any data set of videos, songs, color palettes, wallpaper patterns, and the like, where the data itself is not compressed, but the associated semantic information that describes the data in a record is compressed. Generally, logical semantic compression can also be applicable for any data set that has selectable data links, or HTML hyperlinks, and common information associated with each data link. An example includes a Web site that offers to create a list of items in a "shopping cart" for a consumer viewing the Web site and selecting items to purchase. When the consumer selects an item, common script code associated with a data link for each item adds the selected item to the shopping cart list for the consumer. The common script code can be compressed as semantic information before a data set of the items is transmitted to the consumer's computing device, and each item can be expanded to include the common script code using an expansion function at the consumer's computing device upon receiving the data set of selectable items.

Figure 4:
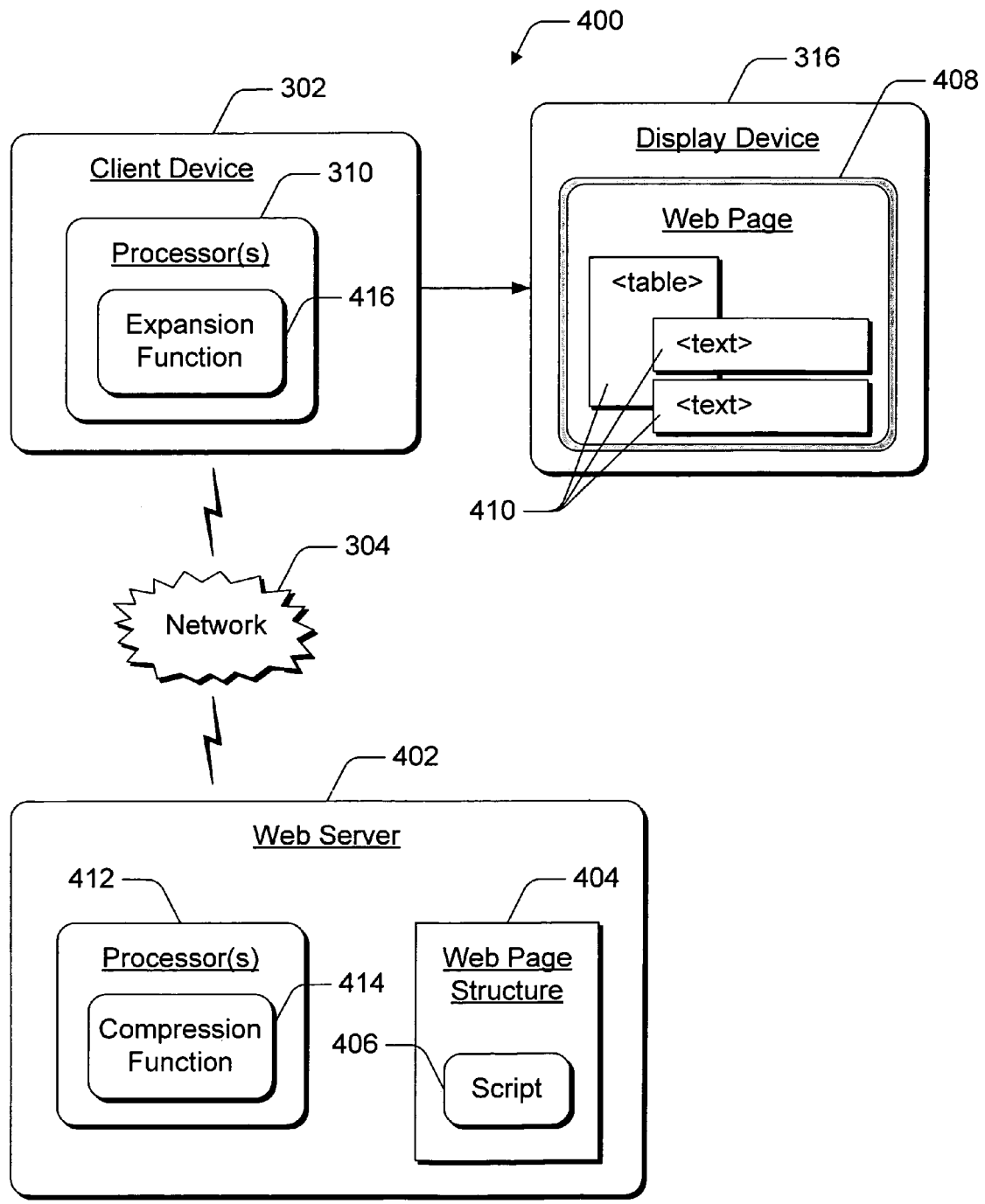
FIG. 4 is a block diagram that illustrates various components of a client-server network architecture.

FIG. 4 illustrates a logical semantic compression system 400 that can be implemented to reduce the size of HTML code transmitted, or otherwise communicated, from a Web page server 402 to a client device 302 via a network system 304. Client device 302, network system 304, and the associated components, are described above with reference to FIG. 3.

A Web site, such as an e-commerce business, that provides data when requested can use common Web page structure data, including tables, text, and the like, formatted for a uniform presentation across several pages of the Web site. A Web site can implement Web server 402 that provides Web page structure 404 to display requested data in a Web page. The Web page structure 404, which can be HTML code, for example, includes a script function 406 that generates the Web page structure when a Web page is requested by client device 302.

Typically, Web server 402 would provide Web page structure 404 and the data to be displayed in the Web page with each Web page requested by client device 302, which is then displayed as Web page 408 on display device 316.

Web page 408 has structure data 410 to identify the type of data that is to be filled in the Web page 408.

Logical semantic compression can be utilized to reduce the size of a Web page structure that will be transmitted to a destination device. Web server 402 has one or more processors 412 that execute a compression function 414 to reduce the size of Web page structure 404. When client device 302 requests a Web page, Web server 402 can encode Web page structure 404 using compression function 414. Web page structure 404 can be encoded as a single character, such as an "@" symbol for example. The single character is included in an expansion function 416 that is transmitted to client device 302.

Client device 302 executes expansion function 416 on processor(s) 310 and can construct Web page 408 anytime that the client device requests data from Web server 402 that will be displayed in Web page 408. In response to a request from client device 302 for a Web page, Web server 402 can transmit the requested data and the "@" symbol for the encoded Web page structure. Client device 302 can build the Web page structure after expanding the "@" symbol using expansion function 416, and render the data in the Web page 408 on display device 316.

Figure 5:
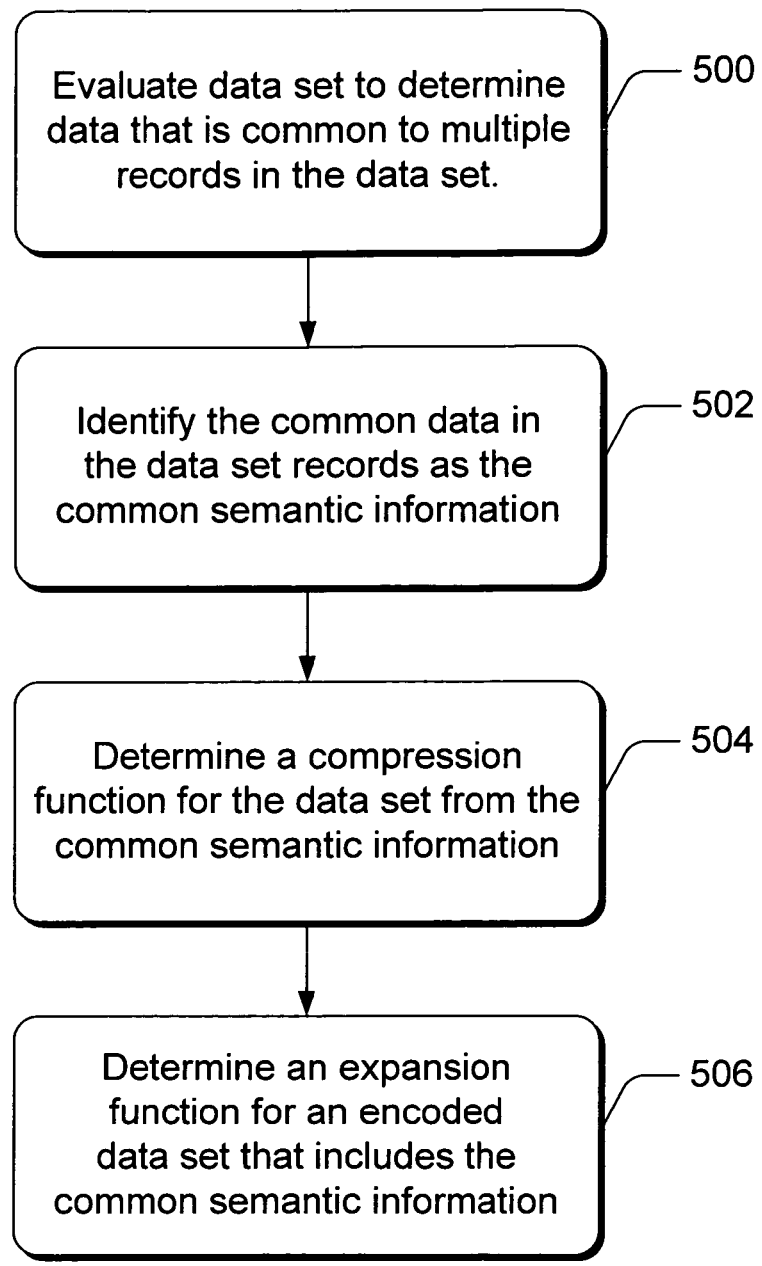
FIG. 5 is a flow diagram of a method for determining logical semantic compression and expansion functions.

FIG. 5 illustrates a method for determining logical semantic compression and expansion functions. The order in which the method is described is not intended to be construed as a limitation. Furthermore, the method can be implemented in any suitable hardware, software, firmware, or combination thereof.

At block 500, a data set having multiple records is evaluated to determine which of the records have data that is common to each of the records. The multiple records include data that is common to each of the records, and data that is not common to each of the records. At block 502, the data that is common to the multiple records in the data set is identified as the semantic information. The developer of a database that data sets are generated from, having prior knowledge of the records structure, can evaluate the data to determine the common semantic information. Additionally, an application program can evaluate a data set to determine the common semantic information.

At block 504, a compression function for the data set is determined, or otherwise created, from the semantic information that is common to the multiple records in the data set. The compression function can be used to encode the data set to reduce the size of the data set for storage, transmission, or similar purposes. At block 506, an expansion function for the data set is determined, or otherwise created, and includes the semantic information that is common to each of the records in the data set. The expansion function can be used to expand the multiple records in an encoded data set to include the common semantic information.

Figure 6:
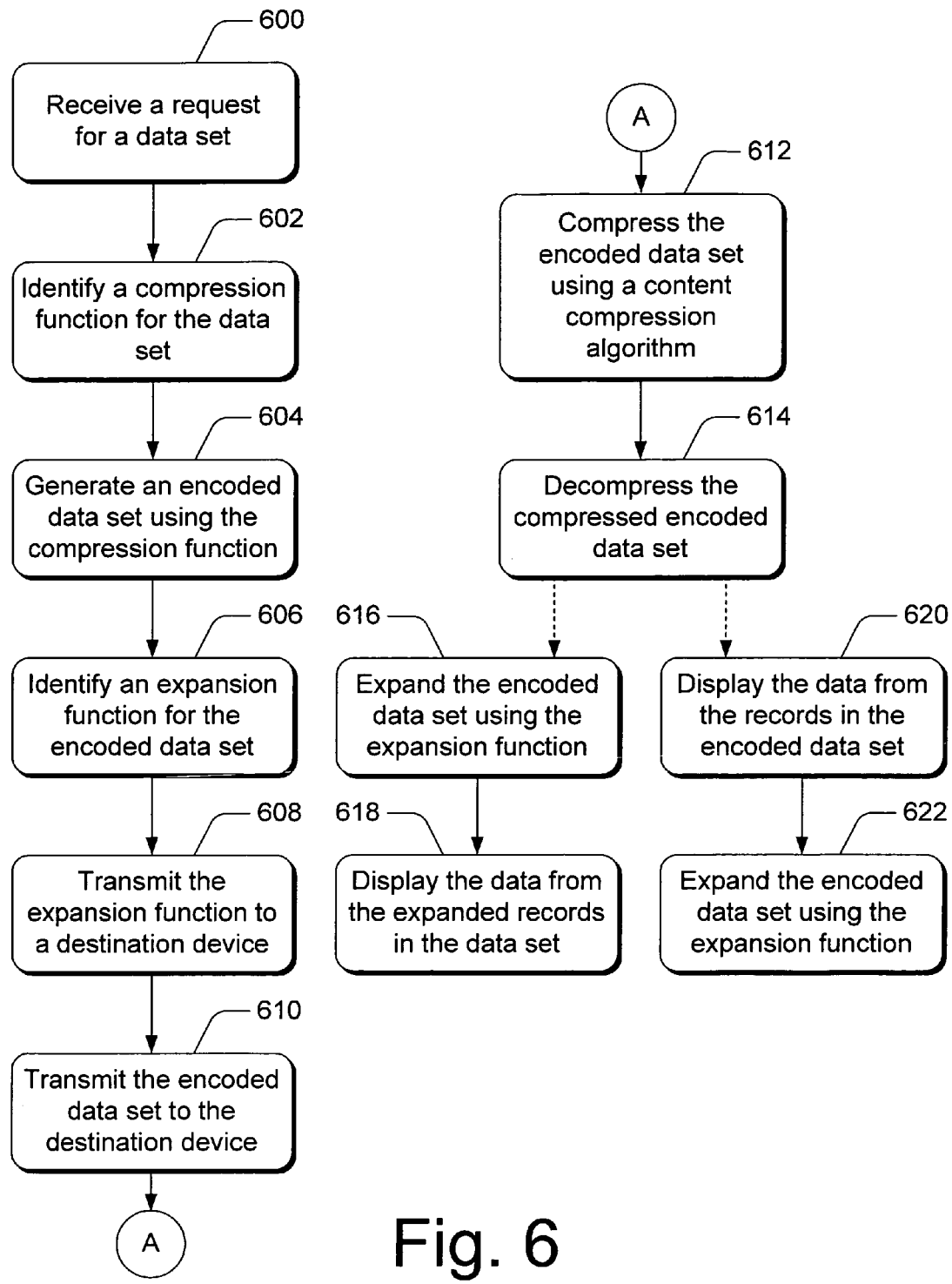
FIG. 6 is a flow diagram of a method for logical semantic compression and expansion.

FIG. 6 illustrates a method for logical semantic compression and expansion. The order in which the method is described is not intended to be construed as a limitation. Furthermore, the method can be implemented in any suitable hardware, software, firmware, or combination thereof.

At block 600, a request for a data set is received. At block 602, a compression function for the data set is identified. The compression function can be determined as described above with reference to FIG. 5. Additionally, the compression function can be determined after receiving the request for the data set, or before. Because context-sensitive compression is logically determined based on the semantic information that is common to multiple records of a data set, the compression function can be determined before the data set is requested.

At block 604, the data set is encoded using the identified compression function to generate an encoded data set. The encoded data set is encoded by removing the semantic information that is common to the individual records in the data set. At block 606, an expansion function associated with the encoded data set is identified. The expansion function can be determined as described above with reference to FIG. 5. The expansion function includes the semantic information that is common to multiple records in the data set.

At block 608, the expansion function is transmitted, or otherwise communicated, to a destination device. At block 610, the encoded data set is also transmitted, or otherwise communicated, to the destination device. At block 612, the encoded data set is further compressed using a content compression algorithm to generate a compressed encoded data set. A communication component such as a modem, for example, can further compress the encoded data set when the encoded data set is transmitted to the destination device.

At block 614, the compressed encoded data set is decompressed to regenerate the encoded data set. A communication component associated with the destination device, such as a destination device modem for example, can decompress the compressed encoded data set when the destination device receives the encoded data set. At block 616, the encoded data set is expanded using the identified expansion function. The encoded data set is expanded such that individual records in the encoded data set are expanded to include the common semantic information. At block 618, the data from the expanded records in the data set are displayed, or otherwise rendered.

As an alternative to the order in which blocks 616 and 618 are described, the data from the individual records in the encoded data set can be displayed, or otherwise rendered, at block 620. At block 622, the encoded data set is expanded such that individual records in the encoded data set are expanded to include the common semantic information. It is an implementation preference to display the data first and then expand individual records of the encoded data set as needed, or expand the encoded data set first and then display the data for each of the records.

Figure 7:
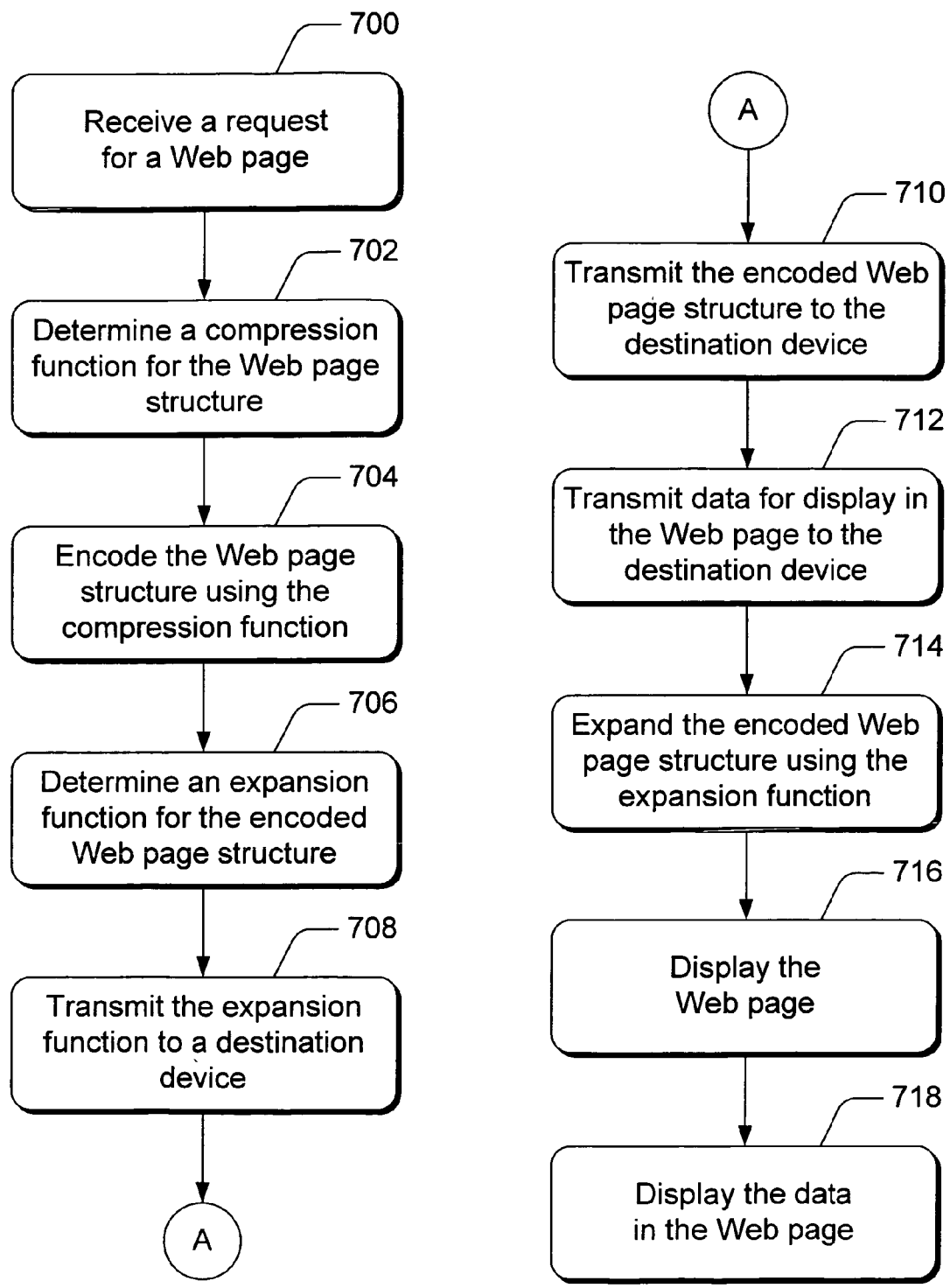
FIG. 7 is a flow diagram of a method for the logical semantic compression and expansion of Web page structures.

FIG. 7 illustrates a method for determining logical semantic compression and expansion functions for a Web page structure. The order in which the method is described is not intended to be construed as a limitation. Furthermore, the method can be implemented in any suitable hardware, software, firmware, or combination thereof.

At block 700, a request for a Web page is received. At block 702, a compression function for the Web page structure is determined. The compression function can be determined by identifying the Web page structure data that is common to multiple Web pages associated with a Web site.

At block 704, the Web page structure is encoded using the determined compression function to generate an encoded Web page structure. For a Web site that implements a common Web page structure for a uniform display of data across several pages, the compression function can encode the Web page structure as a single character, or similar identifier.

At block 706, an expansion function associated with the encoded Web page structure is determined. At block 708, the expansion function is transmitted, or otherwise communicated, to a destination device. At block 710, the encoded Web page structure is also transmitted to the destination device. At block 712, the data that will be displayed in the Web page is also transmitted to the destination device.

At block 714, the encoded Web page structure is expanded using the determined expansion function. The encoded Web page structure is expanded such that the Web page structure can be constructed for display. At block 716, the Web page is displayed, such as on a display device connected to the destination device, and at block 718, the data is displayed in the Web page.

Figure 8:
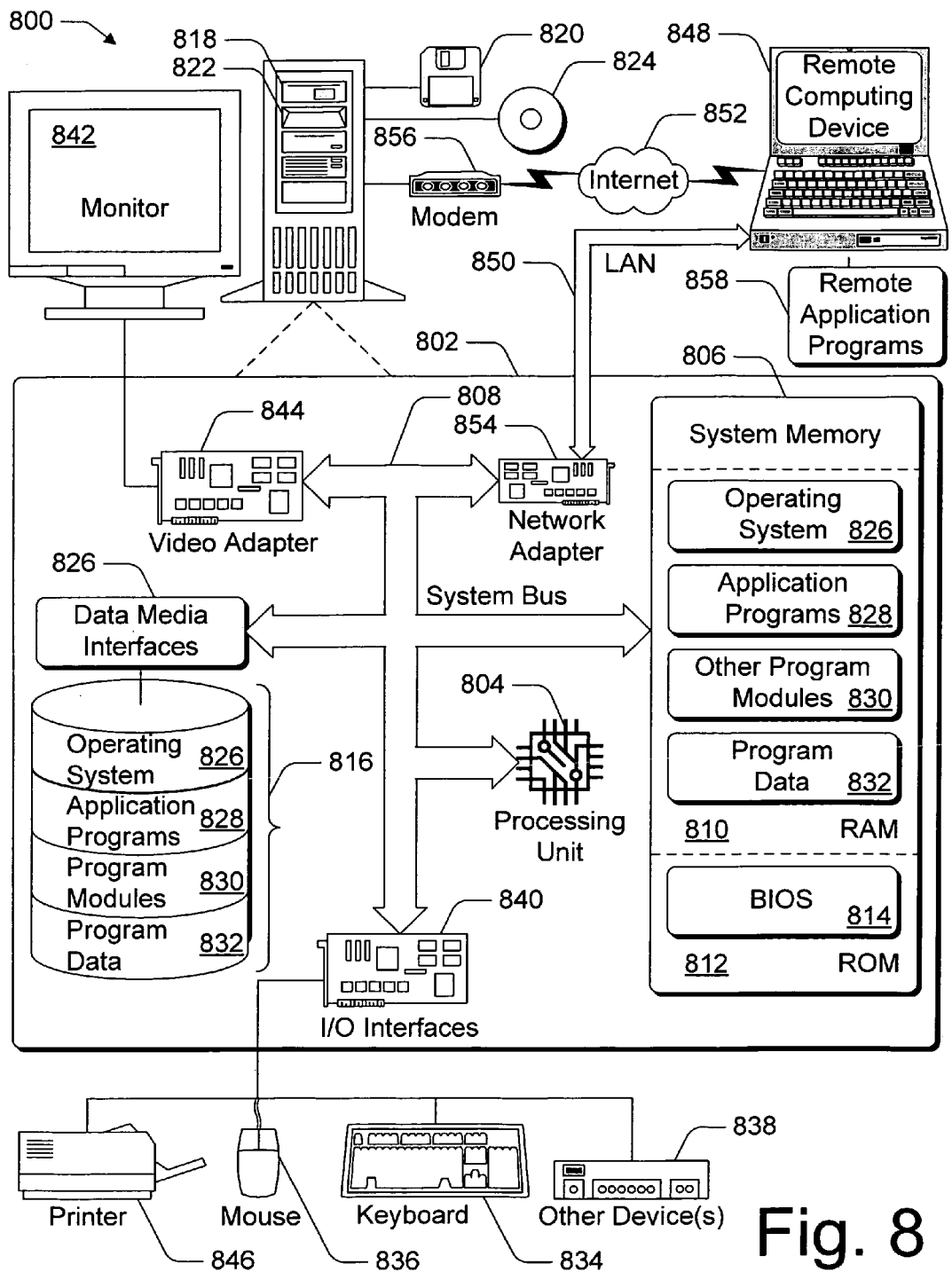
FIG. 8 is a diagram of computing systems, devices, and components in an environment that can be used to implement the invention described herein.

FIG. 8 illustrates an example of a computing environment 800 within which the computer, network, and system architectures described herein can be either fully or partially implemented. Exemplary computing environment 800 is only one example of a computing system and is not intended to suggest any limitation as to the scope of use or functionality of the network architectures. Neither should the computing environment 800 be interpreted as having any dependency or requirement relating to any one or combination of components illustrated in the exemplary computing environment 800.

The computer and network architectures can be implemented with numerous other general purpose or special purpose computing system environments or configurations. Examples of well known computing systems, environments, and/or configurations that may be suitable for use include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, gaming consoles, distributed computing environments that include any of the above systems or devices, and the like.

Logical semantic compression may be described in the general context of computer-executable instructions, such as program modules, being executed by a computer. Generally, program modules include routines, programs, objects, components, data structures, etc. that perform particular tasks or implement particular abstract data types. Logical semantic compression may also be practiced in distributed computing environments where tasks are performed by remote processing devices that are linked through a communications network. In a distributed computing environment, program modules may be located in both local and remote computer storage media including memory storage devices.

The computing environment 800 includes a general-purpose computing system in the form of a computer 802. The components of computer 802 can include, by are not limited to, one or more processors or processing units 804, a system memory 806, and a system bus 808 that couples various system components including the processor 804 to the system memory 806.

The system bus 808 represents one or more of any of several types of bus structures, including a memory bus or memory controller, a peripheral bus, an accelerated graphics port, and a processor or local bus using any of a variety of bus architectures. By way of example, such architectures can include an Industry Standard Architecture (ISA) bus, a Micro Channel Architecture (MCA) bus, an Enhanced ISA (EISA) bus, a Video Electronics Standards Association (VESA) local bus, and a Peripheral Component Interconnects (PCI) bus also known as a Mezzanine bus.

Computer system 802 typically includes a variety of computer readable media. Such media can be any available media that is accessible by computer 802 and includes both volatile and non-volatile media, removable and non-removable media. The system memory 806 includes computer readable media in the form of volatile memory, such as random access memory (RAM) 810, and/or non-volatile memory, such as read only memory (ROM) 812. A basic input/output system (BIOS) 814, containing the basic routines that help to transfer information between elements within computer 802, such as during start-up, is stored in ROM 812. RAM 810 typically contains data and/or program modules that are immediately accessible to and/or presently operated on by the processing unit 804.

Computer 802 can also include other removable/non-removable, volatile/non-volatile computer storage media. By way of example, FIG. 8 illustrates a hard disk drive 816 for reading from and writing to a non-removable, non-volatile magnetic media (not shown), a magnetic disk drive 818 for reading from and writing to a removable, non-volatile magnetic disk 820 (e.g., a "floppy disk"), and an optical disk drive 822 for reading from and/or writing to a removable, non-volatile optical disk 824 such as a CD-ROM, DVD-ROM, or other optical media. The hard disk drive 816, magnetic disk drive 818, and optical disk drive 822 are each connected to the system bus 808 by one or more data media interfaces 826. Alternatively, the hard disk drive 816, magnetic disk drive 818, and optical disk drive 822 can be connected to the system bus 808 by a SCSI interface (not shown).

The disk drives and their associated computer-readable media provide non-volatile storage of computer readable instructions, data structures, program modules, and other data for computer 802. Although the example illustrates a hard disk 816, a removable magnetic disk 820, and a removable optical disk 824, it is to be appreciated that other types of computer readable media which can store data that is accessible by a computer, such as magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like, can also be utilized to implement the exemplary computing system and environment.

Any number of program modules can be stored on the hard disk 816, magnetic disk 820, optical disk 824, ROM 812, and/or RAM 810, including by way of example, an operating system 826, one or more application programs 828, other program modules 830, and program data 832. Each of such operating system 826, one or more application programs 828, other program modules 830, and program data 832 (or some combination thereof) may include an embodiment of logical semantic compression.

Computer system 802 can include a variety of computer readable media identified as communication media. Communication media typically embodies computer readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

A user can enter commands and information into computer system 802 via input devices such as a keyboard 834 and a pointing device 836 (e.g., a "mouse"). Other input devices 838 (not shown specifically) may include a microphone, joystick, game pad, satellite dish, serial port, scanner, and/or the like. These and other input devices are connected to the processing unit 804 via input/output interfaces 840 that are coupled to the system bus 808, but may be connected by other interface and bus structures, such as a parallel port, game port, or a universal serial bus (USB).

A monitor 842 or other type of display device can also be connected to the system bus 808 via an interface, such as a video adapter 844. In addition to the monitor 842, other output peripheral devices can include components such as speakers (not shown) and a printer 846 which can be connected to computer 802 via the input/output interfaces 840.

Computer 802 can operate in a networked environment using logical connections to one or more remote computers, such as a remote computing device 848. By way of example, the remote computing device 848 can be a personal computer, portable computer, a server, a router, a network computer, a peer device or other common network node, and the like. The remote computing device 848 is illustrated as a portable computer that can include many or all of the elements and features described herein relative to computer system 802.

Logical connections between computer 802 and the remote computer 848 are depicted as a local area network (LAN) 850 and a general wide area network (WAN) 852. Such networking environments are commonplace in offices, enterprise-wide computer networks, intranets, and the Internet. When implemented in a LAN networking environment, the computer 802 is connected to a local network 850 via a network interface or adapter 854. When implemented in a WAN networking environment, the computer 802 typically includes a modem 856 or other means for establishing communications over the wide network 852. The modem 856, which can be internal or external to computer 802, can be connected to the system bus 808 via the input/output interfaces 840 or other appropriate mechanisms. It is to be appreciated that the illustrated network connections are exemplary and that other means of establishing communication link(s) between the computers 802 and 848 can be employed.

In a networked environment, such as that illustrated with computing environment 800, program modules depicted relative to the computer 802, or portions thereof, may be stored in a remote memory storage device. By way of example, remote application programs 858 reside on a memory device of remote computer 848. For purposes of illustration, application programs and other executable program components, such as the operating system, are illustrated herein as discrete blocks, although it is recognized that such programs and components reside at various times in different storage components of the computer system 802, and are executed by the data processor(s) of the computer.

Logical semantic compression is particularly useful for records in data sets that have data and a significant quantity of semantic information relative to the size of the data. Logical semantic compression is also particularly useful when considering the quantity of data to be transmitted to a destination device in relation to the time that it takes to transmit the data over a slow bandwidth connection, for example. Even when transmitting a data set over a fast connection, logical semantic compression will decrease the time that it takes to transmit the data set if the data set is large in proportion to the speed of the connection.

Although the systems and methods have been described in language specific to structural features and/or methodological steps, it is to be understood that the invention defined in the appended claims is not necessarily limited to the specific features or steps described. Rather, the specific features and steps are disclosed as preferred forms of implementing the claimed invention.

The invention claimed is:

1. A method, comprising:

determining a compression function at a server in response to a received request, the compression function determined for multiple Web pages associated with a Web site by identifying Web page structure data that is common to the multiple Web pages;

generating an encoded Web page structure using the compression function by removing the Web page structure data that is common to the multiple Web pages;

determining an expansion function for the encoded Web page structure, the expansion function including the Web page structure data that is common to the multiple Web pages; and transmitting the expansion function and the encoded Web page structure to a destination device.

2. A method as recited in claim 1, further comprising expanding the encoded Web page structure using the expansion function.

3. A method as recited in claim 1, further comprising representing the encoded Web page structure with a single character identifier when said generating the encoded Web page structure.

4. A method as recited in claim 1, further comprising representing the encoded Web page structure with a single character identifier when said generating the encoded Web page structure if all of the Web page structure data is common to the multiple Web pages.

5. A method as recited in claim 1, wherein the Web page structure data is HTML (hypertext markup language) code.

6. One or more computer-readable storage media encoded with computer-executable instructions that, when executed, direct a computing-based device to:

determine a compression function at a server in response to a received request, the compression function determined for multiple Web pages associated with a Web site by identifying Web page structure data that is common to the multiple Web pages;

generate an encoded Web page structure using the compression function by removing the Web page structure data that is common to the multiple Web pages;

determine an expansion function for the encoded Web page structure, the expansion function including the Web page structure data that is common to the multiple Web pages; and transmit the expansion function and the encoded Web page structure to a destination device.

7. One or more computer-readable storage media as recited in claim 6, further encoded with computer-executable instructions that, when executed, direct the computing-based device to represent the encoded Web page structure with a single character identifier when the encoded Web page structure is generated.

8. One or more computer-readable storage media as recited in claim 6, further encoded with computer-executable instructions that, when executed, direct the computing-based device to represent the encoded Web page structure with a single character identifier when the encoded Web page structure is generated if all of the Web page structure data is common to the multiple Web pages.

* * * * *